(12) United States Patent
Jee et al.

(10) Patent No.: US 11,488,910 B2
(45) Date of Patent: Nov. 1, 2022

(54) SEMICONDUCTOR PACKAGE HAVING REDISTRIBUTION LAYER

(71) Applicant: Samsung Electronics Co., Ltd., Suwon-si (KR)

(72) Inventors: Young Kun Jee, Hwaseong-si (KR); Il Hwan Kim, Hwaseong-si (KR); Un Byoung Kang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/036,702

(22) Filed: Sep. 29, 2020

(65) Prior Publication Data

US 2021/0020578 A1 Jan. 21, 2021

Related U.S. Application Data

(63) Continuation of application No. 16/201,380, filed on Nov. 27, 2018, now Pat. No. 10,818,603.

(30) Foreign Application Priority Data

Jun. 29, 2018 (KR) .................. 10-2018-0075505

(51) Int. Cl.
| | |
|---|---|
| *H01L 23/538* | (2006.01) |
| *H01L 21/48* | (2006.01) |
| *H01L 25/00* | (2006.01) |
| *H01L 23/00* | (2006.01) |
| *H01L 25/065* | (2006.01) |

(Continued)

(52) U.S. Cl.
CPC ........ *H01L 23/5389* (2013.01); *H01L 21/486* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5384* (2013.01); *H01L 23/5386* (2013.01); *H01L 24/19* (2013.01); *H01L 24/20* (2013.01);

(Continued)

(58) Field of Classification Search
CPC ............. H01L 23/5389; H01L 21/4853; H01L 21/4857; H01L 21/486; H01L 21/565; H01L 23/3128; H01L 23/5386; H01L 24/19; H01L 25/50; H01L 25/112; H01L 25/071
USPC ................................. 257/686, 737
See application file for complete search history.

(56) References Cited

U.S. PATENT DOCUMENTS

| | | |
|---|---|---|
| 8,143,710 B2 | 3/2012 | Cho |
| 8,263,439 B2 | 9/2012 | Marimuthu et al. |

(Continued)

OTHER PUBLICATIONS

Notice of Allowance dated Jun. 24, 2020, issued in corresponding U.S. Appl. No. 16/201,380.

*Primary Examiner* — David Vu
*Assistant Examiner* — Brandon C Fox
(74) *Attorney, Agent, or Firm* — Harness, Dickey & Pierce, P.L.C.

(57) ABSTRACT

A semiconductor package includes a silicon substrate including a cavity and a plurality of through holes spaced apart from the cavity, a first semiconductor chip in the cavity, a plurality of conductive vias in the plurality of through holes, a first redistribution layer on the silicon substrate and connected to the first semiconductor chip and the conductive vias, and a second redistribution layer below the silicon substrate and connected to the first semiconductor chip and the plurality of conductive vias.

18 Claims, 10 Drawing Sheets

(51) Int. Cl.
  *H01L 21/56* (2006.01)
  *H01L 23/31* (2006.01)
  *H01L 25/11* (2006.01)
  *H01L 25/07* (2006.01)
(52) U.S. Cl.
  CPC ........ *H01L 25/0652* (2013.01); *H01L 25/071* (2013.01); *H01L 25/112* (2013.01); *H01L 25/50* (2013.01); *H01L 2224/214* (2013.01); *H01L 2225/06513* (2013.01); *H01L 2225/06541* (2013.01); *H01L 2225/06548* (2013.01); *H01L 2225/06555* (2013.01); *H01L 2225/06586* (2013.01)

(56) References Cited

U.S. PATENT DOCUMENTS

| | | |
|---|---|---|
| 8,455,995 B2 | 6/2013 | Tsai et al. |
| 9,490,192 B1 | 11/2016 | Chen et al. |
| 2007/0007641 A1 | 1/2007 | Lee et al. |
| 2008/0157316 A1* | 7/2008 | Yang ........................ H01L 25/50 257/685 |
| 2008/0169548 A1 | 7/2008 | Baek |
| 2008/0237828 A1 | 10/2008 | Yang |
| 2014/0057394 A1 | 2/2014 | Ramasamy et al. |
| 2014/0133105 A1 | 5/2014 | Yee et al. |
| 2015/0155256 A1* | 6/2015 | Lin ........................ H01L 23/552 257/737 |
| 2015/0206856 A1* | 7/2015 | Kwok .................. G02B 6/4201 257/797 |
| 2016/0093572 A1 | 3/2016 | Chen |
| 2016/0118333 A1 | 4/2016 | Lin |
| 2017/0062383 A1* | 3/2017 | Yee ........................ H01L 24/17 |
| 2017/0256480 A1 | 9/2017 | Reingruber et al. |
| 2018/0076103 A1 | 3/2018 | Jeon et al. |
| 2018/0145061 A1* | 5/2018 | Jeong .................. H01L 23/3121 |
| 2019/0006305 A1 | 1/2019 | Huang |
| 2019/0139897 A1* | 5/2019 | Liang .................. H01Q 21/065 |

\* cited by examiner

SEMICONDUCTOR PACKAGE HAVING REDISTRIBUTION LAYER

CROSS-REFERENCE TO RELATED APPLICATION

This application is a continuation of U.S. application Ser. No. 16/201,380, filed on Nov. 27, 2018, which claims priority to Korean Patent Application No. 10-2018-0075505, filed on Jun. 29, 2018, the disclosure of each of which is incorporated herein by reference in its entirety.

BACKGROUND

1. Field

Apparatuses and methods according to example embodiments relate to a semiconductor package including a redistribution layer and a manufacturing method thereof.

2. Description of Related Art

As semiconductor devices are becoming highly integrated, technologies for increasing integration degrees of a semiconductor chip and a semiconductor package on which the semiconductor chip is mounted and decreasing sizes thereof have emerged. As electronic products are becoming smaller in size, much attention has been paid to a system-in-package technique for mounting a large number of multi-functional semiconductor chips in a single package to process a large amount of data. Generally, a semiconductor package technique for mounting semiconductor chips on a printed circuit board has been used but manufacturing a thin semiconductor package is limited when such a printed circuit board is used. To solve this problem, a fan-out wafer-level package technique has been developed, in which a redistribution layer is formed below semiconductor chips instead of a printed circuit board. To make a semiconductor package small, a method of reducing distances between through electrodes electrically connecting a plurality of semiconductor chips in the semiconductor package is needed.

SUMMARY

Example embodiments of inventive concepts are directed to providing a semiconductor package, in which conductive vias are formed in a substrate to decrease distance between the conductive vias.

In addition, example embodiments of inventive concepts are directed to providing a method of manufacturing a semiconductor package, in which spacers are formed on side surfaces of a semiconductor chip and thus a carrier supporting a wafer need not be formed.

Further, example embodiments of inventive concepts are directed to providing a high-performance semiconductor package, in which various and short signal paths are formed by forming redistribution layers to be electrically connected to upper and lower portions of a semiconductor chip.

According to some example embodiments, a semiconductor package includes a silicon substrate including a cavity and a plurality of through holes spaced apart from the cavity; a first semiconductor chip in the cavity; a plurality of conductive vias in the plurality of through holes; a first redistribution layer on the silicon substrate and the first redistribution layer connected to the first semiconductor chip and the plurality of conductive vias; and a second redistribution layer below the silicon substrate and the second redistribution layer connected to the first semiconductor and the conductive vias.

According to some example embodiments, a semiconductor package includes a silicon substrate including a cavity and a plurality of through holes spaced apart from the cavity; a first semiconductor chip in the cavity; a plurality of conductive vias in the plurality of through holes; a first redistribution layer on the silicon substrate and the first redistribution layer connected to the first semiconductor chip and the plurality of conductive vias; a second redistribution layer below the silicon substrate and the second redistribution layer connected to the first semiconductor chip and the plurality of conductive vias; and a second semiconductor chip on the first redistribution layer and the second semiconductor chip connected to the first redistribution layer.

According to some example embodiments, a semiconductor package includes a silicon substrate including a cavity and a plurality of through holes spaced apart from the cavity; a first semiconductor chip in the cavity; a first redistribution layer on the silicon substrate; a second redistribution layer below the silicon substrate, the second redistribution layer connected to the first semiconductor chip; a second semiconductor chip on the first redistribution layer, the second semiconductor chip connected to the first redistribution layer; a third semiconductor chip on the first semiconductor chip, the third semiconductor chip connected to the first redistribution layer; and a plurality of conductive vias in the plurality of through holes.

DETAILED DESCRIPTION

Hereinafter, in order to clarify a technical idea of inventive concepts, example embodiments of inventive concepts will be described in detail with reference to the accompanying drawings. When describing inventive concepts, well-known functions or components are not described in detail when it is determined that the functions or components would obscure inventive concepts due to unnecessary detail. In the drawings, the same reference numerals or marks are assigned to components having substantially the same functions as much as possible although the components are illustrated in different drawings. For convenience of explanation, an apparatus and a method may be described together.

Figure 1:
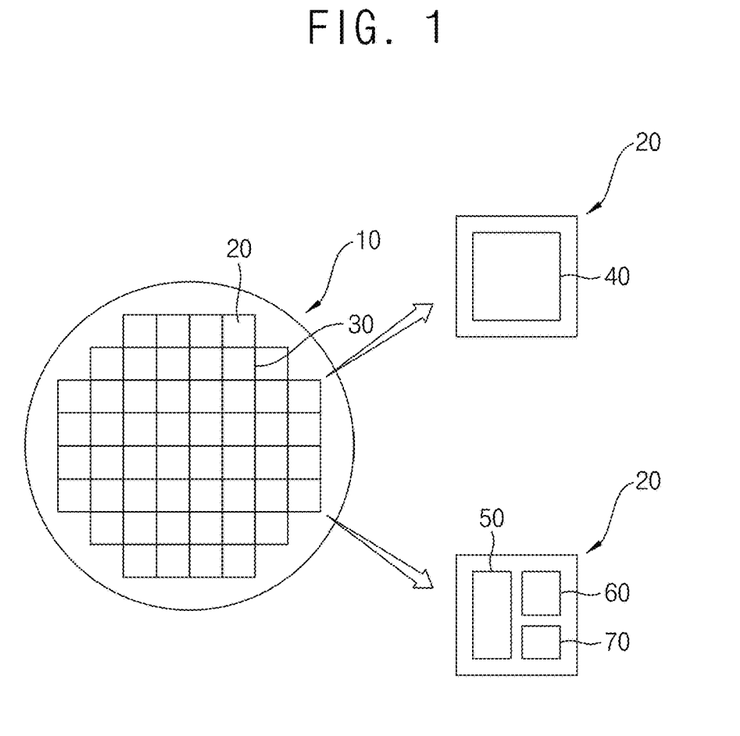
FIG. 1 is a schematic plan view of a wafer for describing a semiconductor package according to some example embodiments.

FIG. 1 is a schematic plan view of a wafer 10 for describing a semiconductor package 100 according to some example embodiments.

Referring to FIG. 1, the wafer 10 may be a semiconductor wafer (e.g., a silicon wafer) and may include a plurality of dies 20. The wafer 10 may be called a substrate 10. The dies 20 may correspond to a substrate 10 of the semiconductor package 100 according to some example embodiments. In an embodiment, a semiconductor chip 40 may be provided on each of the die 20. In another embodiment, a plurality of semiconductor chips 50, 60, and 70 may be provided on one of the dies 20. The dies 20 may be divided by a scribe line 30.

Figure 2:
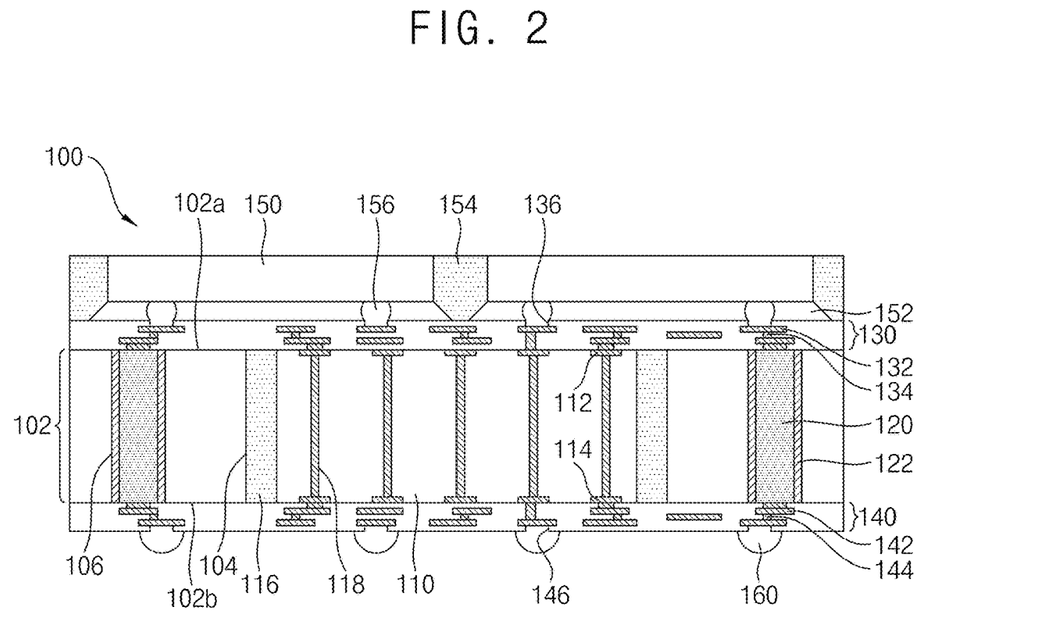
FIG. 2 is a cross-sectional view for describing a semiconductor package according to some example embodiments.

FIG. 2 is a cross-sectional view for describing a semiconductor package 100 according to some example embodiments.

Referring to FIG. 2, the semiconductor package 100 according to some example embodiments may include a substrate 102, a cavity 104, a through hole 106, a first semiconductor chip 110, a conductive via 120, a first redistribution layer 130, and a second redistribution layer 140. The semiconductor package 100 may further include a second semiconductor chip 150 and an external connecting member 160.

The substrate 102 may include silicon, silicon germanium, silicon carbide, or a combination thereof. In an example embodiment, the substrate 102 may include dielectric materials such as silicon oxide, silicon nitride, silicon oxynitride, or a combination thereof, and may be referred to as a dielectric member. In the cross-sectional view of the semiconductor package 100 illustrated in FIG. 2, an upper end and a lower end of the substrate 102 may be respectively referred to as a first surface 102a and a second surface 102b. The first surface 102a and the second surface 102b may face each other. The substrate 102 may include the cavity 104 and the through hole 106.

The cavity 104 may be formed to pass through the substrate 102 in a vertical direction and may be provided in a central region of the semiconductor package 100. An upper end of the cavity 104 may be located at the same level as the first surface 102a of the substrate 102, and a lower end thereof may be located at the same level as the second surface 102b of the substrate 102. The first semiconductor chip 110 may be provided in the cavity 104. In an embodiment, a plurality of first semiconductor chips 110 may be provided. The cavity 104 may be part of a plurality of cavities.

A plurality of through holes 106 may be provided around the cavity 104. The plurality of through holes 106 may be spaced apart from one another. The through holes 106 may be provided in a peripheral region of the substrate 102. The peripheral region may include the same material, e.g., silicon, as the substrate 102. The peripheral region may be formed at a side of the first semiconductor chip 110 and thus may function as a spacer limiting and/or preventing warpage of or damage to the substrate 102 during manufacture of the semiconductor package 100. The spacer may include the through hole 106, the conductive via 120, and a via insulating layer 122.

Figure 3A:
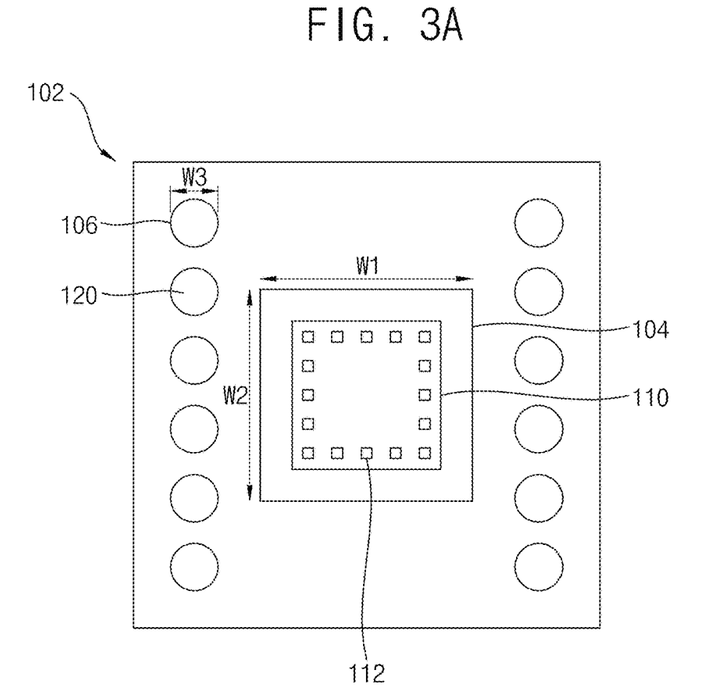
FIGS. 3A and 3B are plan views of examples of the semiconductor package of FIG. 2.
Figure 3B:
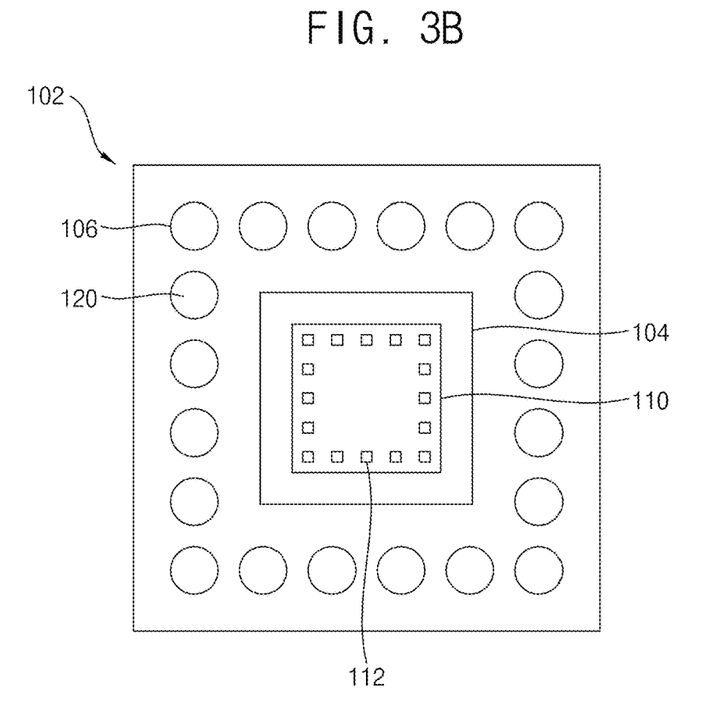

FIGS. 3A and 3B are plan views of examples of the semiconductor package 100 of FIG. 2.

Referring to FIGS. 3A and 3B, a plurality of through holes 106 may be provided around the cavity 104. As illustrated in FIG. 3A, the through holes 106 may be arranged in the form of a pair of lines while having the cavity 104 therebetween. Alternatively, as illustrated in FIG. 3B, the through holes 106 may be arranged to surround the cavity 104.

The through hole 106 may extend from the first surface 102a of the substrate 102 to the second surface 102b thereof and pass through the substrate 102 in the vertical direction. An upper end of the through hole 106 may be at the same level as the first surface 102a of the substrate 102, and a lower end thereof may be located at the same level as the second surface 102b of the substrate 102. The conductive via 120 may be provided in the through hole 106. The through hole 106 may be formed in the spacer including silicon. Thus, the through holes 106 may be provided at minute intervals.

The cavity 104 may have a rectangular shape, and a width W1 and a width W2 thereof may have the same value or different values. A diameter W3 of the through holes 106 may be less than the widths W1 and W2 of the cavity 104. For example, the widths W1 and W2 of the cavity 104 may each be in a range of 3 to 20 mm, and the diameter W3 of the through holes 106 may be in a range of 2 to 50 µm. Forming the conductive via 120 in each of the through holes 106 may be difficult when the diameter W3 of the through holes 106 is extremely narrow. Pitches between the through holes 106 are large when the diameter W3 of the through holes 106 is greater than 50 µm, and thus the through holes 106 may not be appropriately connected to the first redistribution layer 130 or the second redistribution layer 140 if the diameter W3 is greater than 50 µm. The through holes 106 are formed in the silicon substrate 102; and thus the distances therebetween may be less than those when the through holes 106 are formed by punching a molding material. Since the distances between the through holes 106 are minute, the semiconductor package 100 may be formed in a narrower area.

Referring back to FIG. 2, the first semiconductor chip 110 may be provided in the cavity 104. The first semiconductor chip 110 may be a logic chip. For example, the first semiconductor chip 110 may include a microprocessor, a controller, or an application processor (AP). An upper end of the first semiconductor chip 110 may be located at the same level as the upper ends of the cavity 104 and the through hole 106. A lower end of the first semiconductor chip 110 may be located at the same level as the lower ends of the cavity 104 and the through hole 106. A width of the first semiconductor chip 110 may be less than that of the cavity 104.

An upper pad 112 and a lower pad 114 may be formed on the upper end and the lower end of the first semiconductor chip 110, respectively. The upper pad 112 may be electrically connected to the first redistribution layer 130, and the lower pad 114 may be electrically connected to the second redistribution layer 140. The upper pad 112 and the lower pad 114 may be electrically connected to each other by a circuit in the first semiconductor chip 110.

An encapsulant 116 may be provided between an inner side surface of the cavity 104 and a side surface of the first semiconductor chip 110, and the first semiconductor chip 110 may be sealed with the encapsulant 116. An upper end of the encapsulant 116 may be located at the same level as the first surface 102a of the substrate 102, and a lower end thereof may be located at the same level as the second surface 102b of the substrate 102. The encapsulant 116 may include an insulating material and protect the first semiconductor chip 110 in the semiconductor package 100 from external impacts.

In an embodiment, the first semiconductor chip 110 may further include a plurality of through electrodes 118 therein. The through electrodes 118 may electrically connect the upper pad 112 and the lower pad 114. The through electrodes 118 may include at least one of Cu, CuSn, CuMg, CuNi, CuZn, CuPd, CuAu, CuRe, CuW, W, or a conductive paste. In an embodiment, the through electrodes 118 may be omitted.

The conductive via 120 may be provided in the through hole 106. The conductive via 120 may include a metal, e.g., copper. An upper end of the conductive via 120 may be located at the same level as the first surface 102a of the substrate 102, and a lower end thereof may be located at the same level as the second surface 102b of the substrate 102. Referring to FIGS. 3A and 3B, a plurality of conductive vias 120 may be formed around the first semiconductor chip 110. As illustrated in FIG. 3A, the conductive vias 120 may be arranged in the form of a pair of lines while having the cavity 104 therebetween. Alternatively, as illustrated in FIG. 3B, the conductive vias 120 may be arranged to surround the cavity 104.

The via insulating layer 122 may be formed at an outer side of the conductive via 120 to cover an inner side surface of the through hole 106. The via insulating layer 122 may electrically insulate the substrate 102 and the conductive via 120 from each other. The via insulating layer 122 may be formed in multiple layers and include a barrier film 123 and an insulating film 124 which will be described below.

Referring back to FIG. 2, the first redistribution layer 130 and the second redistribution layer 140 may be formed on opposite surfaces of the substrate 102. The first redistribution layer 130 may be formed on the first surface 102a of the substrate 102 to be electrically connected to the first semiconductor chip 110, the conductive via 120, and the second semiconductor chip 150. The second redistribution layer 140 may be formed on the second surface 102b of the substrate 102 to be electrically connected to the first semiconductor chip 110, the conductive via 120, and the external connecting member 160. The first redistribution layer 130 and the second redistribution layer 140 may perform various functions according to designs thereof. For example, the first redistribution layer 130 and the second redistribution layer 140 may include a ground pattern GND, a power pattern PWR, a signal pattern S, etc. Here, the signal pattern S includes various types of signals, e.g., a data signal, excluding the ground pattern GND, the power pattern PWR, etc.

The first redistribution layer 130 may include an interconnection pattern 132 and a via 134. The interconnection pattern 132 may be electrically connected to the upper pad 112, the conductive vias 120, and an inner connecting member 156. The interconnection pattern 132 exposed via an opening 136 may be connected to the inner connecting member 156. The second redistribution layer 140 may include an interconnection pattern 142 and a via 144. The interconnection pattern 142 may be electrically connected to the lower pad 114, the conductive vias 120, and the external connecting member 160. The interconnection pattern 142 exposed via an opening 146 may be connected to the external connecting member 160. The interconnection pattern 132 and the via 134 may be integrally formed with each other, and the interconnection pattern 142 and the via 144 may be integrally formed with each other. The vias 134 and 144 may electrically connect the interconnection patterns 132 and 142 formed at different layers. The vias 134 and 144 may each have a tapered form. The interconnection patterns 132 and 142 and the vias 134 and 144 may provide various signal paths in the semiconductor package 100.

The second semiconductor chip 150 may be provided on the first redistribution layer 130. A plurality of second semiconductor chips 150 may be formed and attached to the first redistribution layer 130 by chip-to-wafer bonding. The second semiconductor chip 150 may be a memory device. For example, the second semiconductor chip 150 may include a memory device, such as a flash memory, a dynamic random access memory (DRAM), a static RAM (SRAM), an electrically erasable programmable read-only memory (EEPROM), a phase-change RAM (PRAM), a magnetic RAM (MRAM), a resistive RAM (ReRAM), a high-bandwidth memory (HBM), or a hybrid memory cubic (HMC).

An underfill 152 may be formed between lower surfaces of the second semiconductor chips 150 and the first redistribution layer 130. Some regions between the first redistribution layer 130 and the second semiconductor chips 150 and some regions between the second semiconductor chips 150 may be sealed with the underfill 152. In an embodiment, the underfill 152 may be a non-conductive film (NCF) or non-conductive paste (NCP). An encapsulant 154 may be formed on side surfaces of the second semiconductor chip 150 and on the underfill 152. An upper end of the encapsulant 154 may be located at the same level as upper ends of the second semiconductor chips 150. The encapsulant 154 may include an insulating material and protect the second semiconductor chips 150 in the semiconductor package 100 from external impacts. The inner connecting member 156 may be formed on lower surfaces of the second semiconductor chips 150 and connected to the interconnection pattern 132 of the first redistribution layer 130. The inner connecting member 156 may electrically connect the second semiconductor chips 150 and the first redistribution layer 130. The inner connecting member 156 may be a solder ball or an electrode pad.

The external connecting member 160 may be formed on a lower surface of the second redistribution layer 140. The external connecting member 160 may be connected to the interconnection pattern 142 of the second redistribution layer 140. For example, the semiconductor package 100 according to some example embodiments may be mounted on a main board of an electronic device via the external connecting member 160. The second redistribution layer 140 may be electrically connected to an external device (not shown) via the external connecting member 160. Thus, the first semiconductor chip 110 and the second semiconductor chip 150 may be electrically connected to an external device. The external connecting member 160 may be a solder ball.

Figure 4:
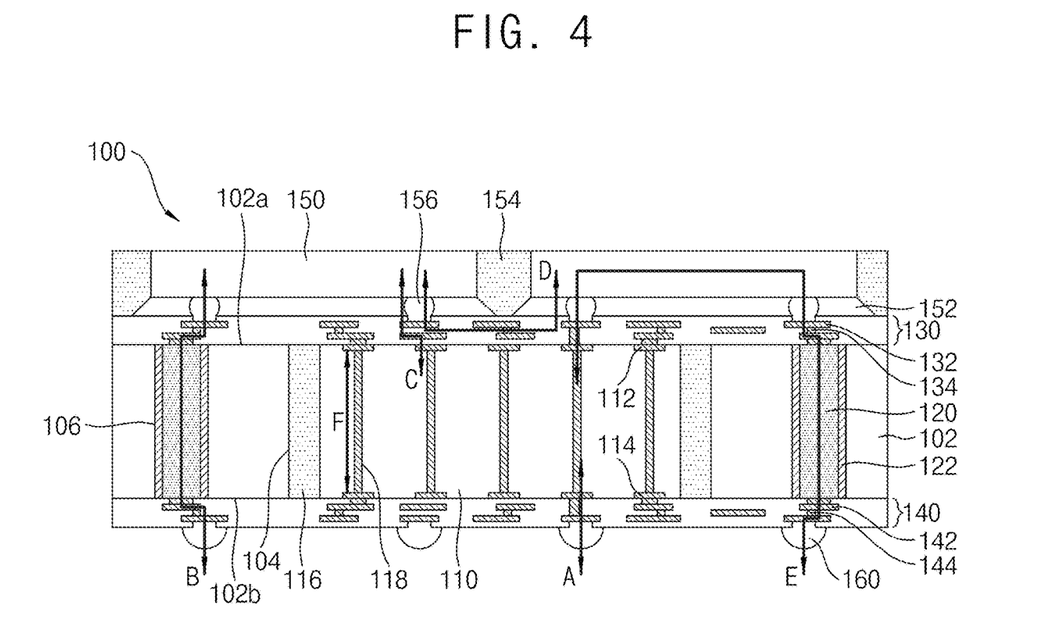
FIG. 4 is a cross-sectional view for describing a signal transmission path of a semiconductor package according to some example embodiments.

FIG. 4 is a cross-sectional view for describing a signal transmission path of a semiconductor package 100 according to some example embodiments.

Referring to FIG. 4, the semiconductor package 100 according to some example embodiments may be electrically connected in signal paths A, B, C, D, E, and F. In an embodiment, a first semiconductor chip 110 may be a logic chip, a second semiconductor chip 150 may be a memory chip, and the first semiconductor chip 110 and the second semiconductor chip 150 may exchange a signal in the semiconductor package 100.

In the first signal path A, the first semiconductor chip 110 may exchange a signal with an external device (not shown). For example, the first semiconductor chip 110 may be electrically connected to an external connecting member 160 via a lower pad 114 and a second redistribution layer 140. A VSS signal, a VCC signal, a data signal, etc. may be transmitted to the first semiconductor chip 110 via the first signal path A.

In the second signal path B, the second semiconductor chip 150 may exchange a signal with an external device (not shown). For example, the second semiconductor chip 150 may be electrically connected to the external connecting member 160 via an inner connecting member 156, a first redistribution layer 130, a conductive via 120, and a second redistribution layer 140. The VSS signal, the VCC signal, the data signal, etc. may be transmitted to the second semiconductor chip 150 via the second signal path B.

In the third signal path C, the first semiconductor chip 110 may exchange a signal with the second semiconductor chip 150. For example, the first semiconductor chip 110 may be electrically connected to the second semiconductor chip 150 via the upper pad 112, the first redistribution layer 130, and the inner connecting member 156.

In the fourth signal path D, a plurality of second semiconductor chips 150 may exchange a signal with each other. For example, the plurality of second semiconductor chips 150 may be electrically connected via the inner connecting member 156 and the first redistribution layer 130. Input/output signals may be provided between the first semiconductor chip 110 and the second semiconductor chip 150 via the fourth signal path D.

In the fifth signal path E, the first semiconductor chip 110 may exchange a signal with an external device via the second semiconductor chip 150. For example, the first semiconductor chip 110 may be electrically connected to the external connecting member 160 via the upper pad 112, the first redistribution layer 130, the inner connecting member 156, the second semiconductor chip 150, the conductive via 120, and the second redistribution layer 140.

In the sixth signal path F, the upper pad 112 and the lower pad 114 of the first semiconductor chip 110 may exchange a signal with each other. For example, the upper pad 112 may be electrically connected to the lower pad 114 via a through electrode 118. According to the sixth signal path F, a signal transmitted to an external device from the second semiconductor chip 150 via the first semiconductor chip 110 may be transmitted via the third signal path C, the sixth signal path F, and the first signal path A without being transmitted via the fifth signal path E.

Figure 5:
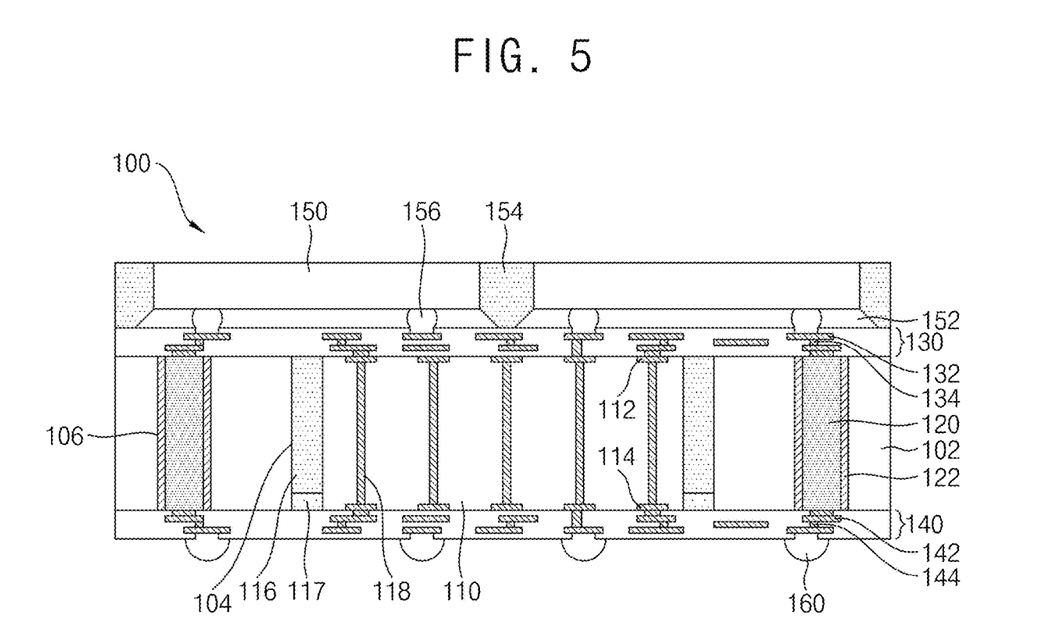
FIGS. 5, 6 and 7 are cross-sectional views of semiconductor packages according to other example embodiments.
Figure 6:
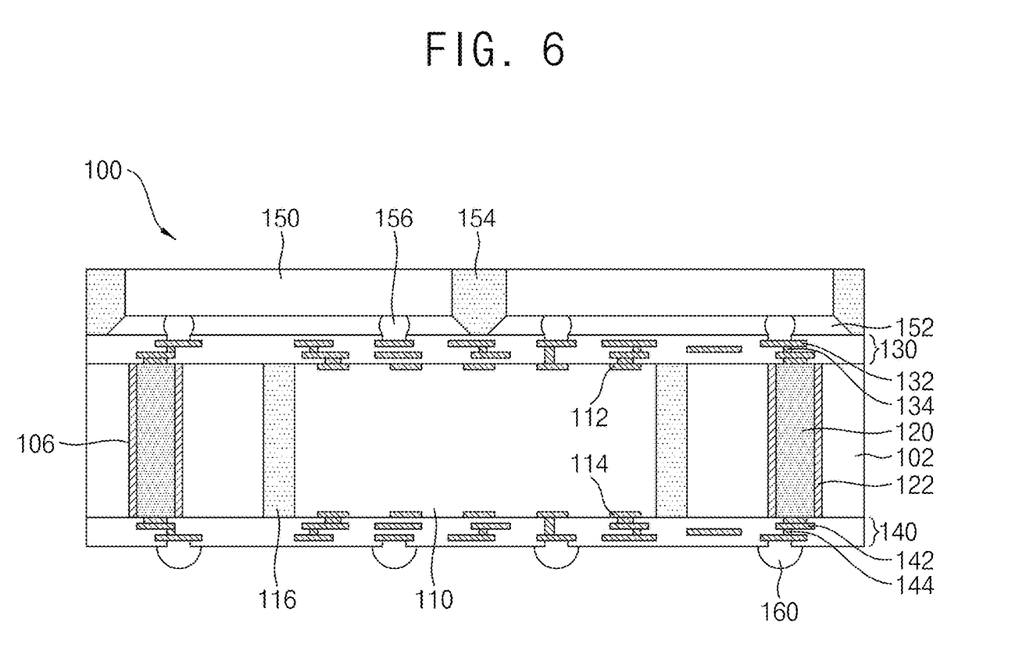
Figure 7:
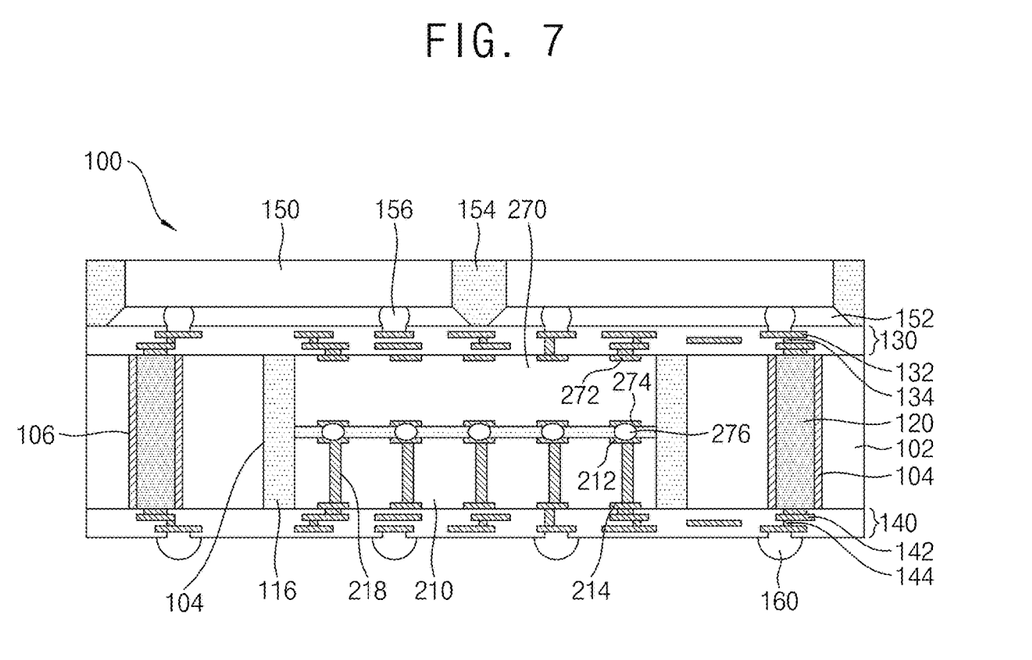

FIGS. 5, 6 and 7 are cross-sectional views of semiconductor packages 100 according to other example embodiments. A detailed description of components which are the same as those described above with reference to FIG. 2 may be omitted herein.

Referring to FIG. 5, a cavity 104 may further include an adhesive 117. The adhesive 117 may be formed in the cavity 104 between side surfaces of a first semiconductor chip 110 and may be located below an encapsulant 116. The first semiconductor chip 110 may be fixed using the adhesive 117 during mounting of the first semiconductor chip 110 in the cavity 104, and may include a die attach film (DAF), an NCF, or NCP. The adhesive 117 may be removed during the mounting of the first semiconductor chip 110 and planarizing of the second surface 102b of the substrate 102, but in an embodiment, the adhesive 117 may remain on the side surfaces of the first semiconductor chip 110.

Referring to FIG. 6, the first semiconductor chip 110 may not include the through electrode 118. Even when the through electrode 118 is not formed, an upper pad 112 and a lower pad 114 may be electrically connected via the inside of the first semiconductor chip 110. Accordingly, a first redistribution layer 130 and a second redistribution layer 140 may be electrically connected via the first semiconductor chip 110.

Referring to FIG. 7, the cavity 104 may further include a first upper semiconductor chip 270 therein. A first lower semiconductor chip 210 may be located at a lower portion of the cavity 104 and include an upper pad 212, a lower pad 214, and a through electrode 218 connecting the upper pad 212 and the lower pad 214. The first upper semiconductor chip 270 may be located on the first lower semiconductor chip 210 and include an upper pad 272 and a lower pad 274. The upper pad 272 and the lower pad 274 may be electrically connected in the first upper semiconductor chip 270. In an embodiment, a through electrode connecting the upper pad 272 and the lower pad 274 may be formed. The first upper semiconductor chip 270 may be electrically connected to the first lower semiconductor chip 210 via an inner connecting member 276. For example, the lower pad 274 of the first upper semiconductor chip 270 may be electrically connected to the inner connecting member 276, the upper pad 212, the through electrode, and the lower pad 214. The first upper semiconductor chip 270 may be electrically connected to the second semiconductor chips 150 via the first redistribution layer 130. In addition, the first lower semiconductor chip 210 is electrically connected to the second semiconductor chip via the first redistribution layer 130, the first upper semiconductor chip 270 and the inner connecting member 276. The first upper semiconductor chip 270 may be a memory device such as a DRAM or SRAM, but is not limited thereto.

A method of manufacturing the semiconductor package 100 according to some example embodiments will be described below.

FIGS. 8, 9A, 9B, 10 to 12, 13A, 13B, and 14 to 17 are cross-sectional views sequentially illustrating operations of a method of manufacturing the semiconductor package 100 according to some example embodiments.

Referring to FIG. 1, in the method of manufacturing the semiconductor package 100 according to some example embodiments, a silicon wafer including a substrate 102 is prepared or provided.

Figure 8:
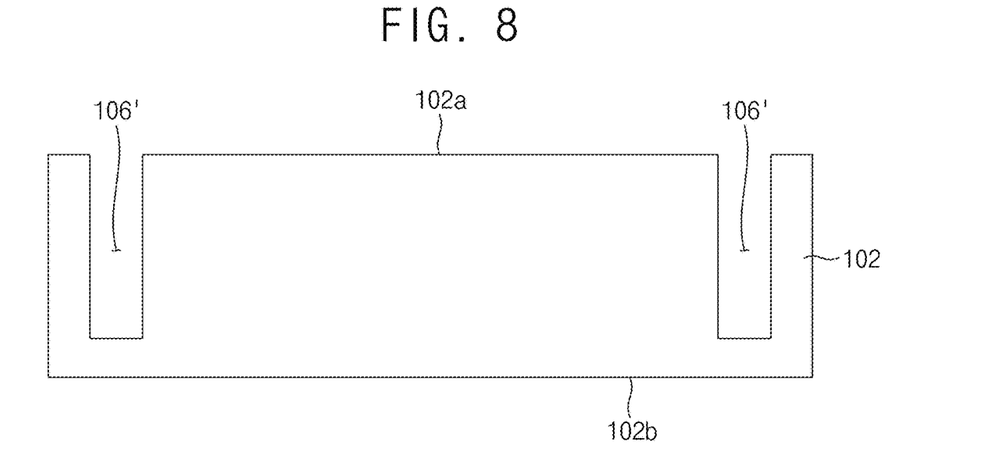
FIGS. 8, 9A, 9B, 10 to 12, 13A, 13B, and 14 to 17 are cross-sectional views sequentially illustrating operations of a method of manufacturing a semiconductor package according to some example embodiments.

Referring to FIG. 8, the substrate 102 is partially etched to form a plurality of second trenches 106' in a first surface 102a of the substrate 102. Referring to FIG. 3, the second trenches 106' may each have a round shape and be formed in an edge region of the substrate 102. The second trenches 106' may be spaced a certain distance from each other and arranged in a rectangular shape, but embodiments are not limited thereto. The second trenches 106' may be formed by reactive ion etching (RIE) or laser drilling.

Figure 9A:
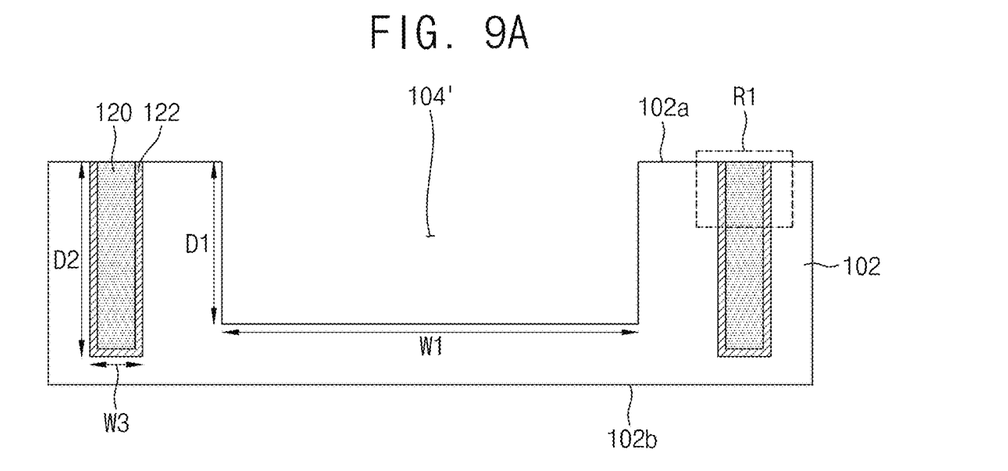

Referring to FIG. 9A, a through silicon via (TSV) structure may be formed in the second trenches 106'. The TSV structure may include a conductive via 120 and a via insulating layer 122. The via insulating layer 122 may be formed on sidewalls and a lower part of the second trench 106', and the inside of the second trench 106' may be filled with the conductive via 120.

Figure 9B:
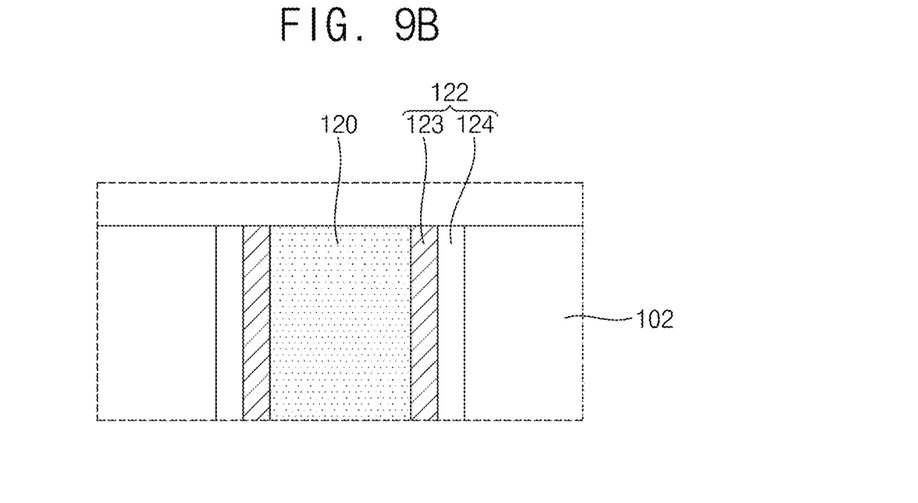

First, the via insulating layer 122 may be formed on the sidewalls and the lower part of the second trench 106'. The via insulating layer 122 may be formed by chemical vapor deposition (CVD), physical vapor deposition (PVD), or atomic layer deposition (ALD). In an embodiment, the via insulating layer 122 may taper from the first surface 102a of the substrate 102 to a second surface 102b thereof. FIG. 9B is an enlarged view of a portion of a region R1 illustrated in FIG. 9A. Referring to FIG. 9B, the via insulating layer 122 may include a barrier film 123 and an insulating film 124. The barrier film 123 may include a conductive layer having low resistance. For example, the barrier film 123 may include at least one selected from among Ti, TiN, Ta, TaN, W, WN, WC, Co, Mn, WN, Ni, and Ru. The barrier film 123 may include at least of Ti, TiN, Ta, TaN, W, WN, WC, Co, Mn, WN, Ni, or Ru. The insulating film 124 may be located at an outer side of the barrier film 123 and electrically insulate the conductive via 120 and the substrate 102 from each other. For example, the insulating film 124 may include one of a silicon oxide, a silicon nitride, a silicon carbide, a polymer, or a combination thereof. Although not shown, in an embodiment, a metal-containing insulating film may be formed between the barrier film 123 and the insulating film 124. The metal-containing insulating film may be formed by oxidizing a portion of the barrier film 123 between the barrier film 123 and the insulating film 124. For example, the metal-containing insulating film may include a tantalum oxide, a tantalum oxynitride, a titanium oxide, a titanium oxynitride, or a combination thereof.

Thereafter, the conductive via 120 may be formed on the via insulating layer 122 to fill the second trench 106'. The conductive via 120 may be formed by an electroplating or CVD. The conductive via 120 may include at least one of Cu, CuSn, CuMg, CuNi, CuZn, CuPd, CuAu, CuRe, CuW, W, or a conductive paste, but is not limited thereto.

The conductive via 120 and the via insulating layer 122 may be formed not only in the second trench 106' but also on the first surface 102a of the substrate 102. The conductive via 120 and the via insulating layer 122 may be partially etched by a chemical mechanical polishing (CMP) to expose the first surface 102a of the substrate 102. The etched conductive via 120 and the via insulating layer 122 may be located at the same level as the first surface 102a of the substrate 102.

Thereafter, a first trench 104' may be formed in the first surface 102a of the substrate 102. The first trench 104' may have a rectangular shape and be formed in a central region of the substrate 102. The first trench 104' may be located between the plurality of second trenches 106', and the plurality of second trenches 106' may be symmetrical with respect to the first trench 104'. In an embodiment, the second trenches 106' may be formed to surround the first trench 104'. A depth of the second trenches 106' may be greater than that of the first trench 104'. A width of the second trenches 106' may be less than that of the first trench 104'. A distance between the second trenches 106' may be less than the width of the first trench 104'. For example, a width W1 of the first trench 104' may be in a range of 3 to 20 mm and a diameter W3 of the second trench 106' may be in a range of 2 to 50 µm. A depth D1 of the first trench 104' may be in a range of 60 to 200 µm, and a depth D2 of the second trench 106' may be in a range of 40 to 200 µm.

Figure 10:
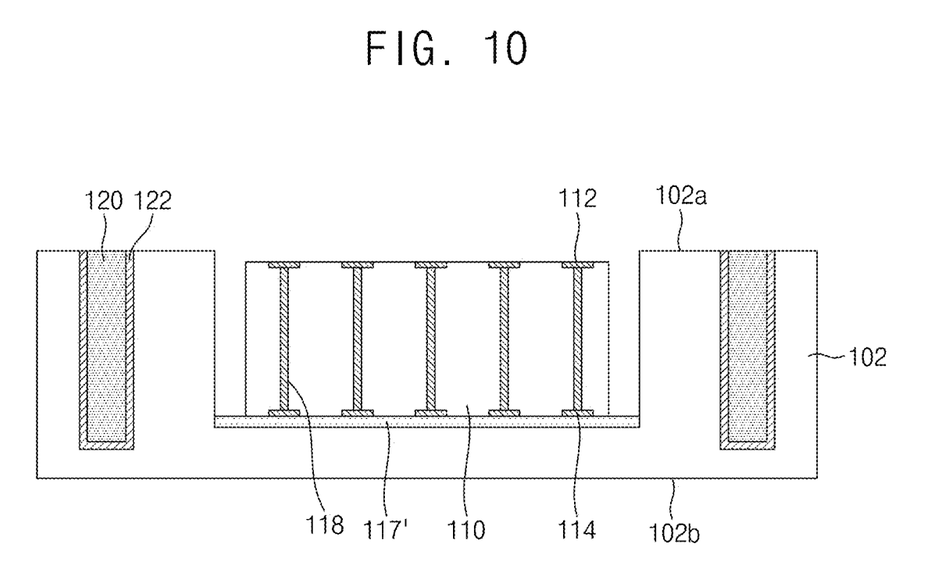

Referring to FIG. 10, a first semiconductor chip 110 may be provided in the first trench 104'. The first semiconductor chip 110 may include a plurality of upper pads 112 on an upper surface thereof, and a plurality of lower pads 114 on a lower surface thereof. An adhesive 117' may be formed between the first semiconductor chip 110 and a lower portion of the first trench 104'. The adhesive 117' may fix the first semiconductor chip 110 and include a DAF, an NCF, or an NCP. The first semiconductor chip 110 may be a logic chip and may include an application processor. A width of the first semiconductor chip 110 may be less than that of the first trench 104'.

Figure 11:
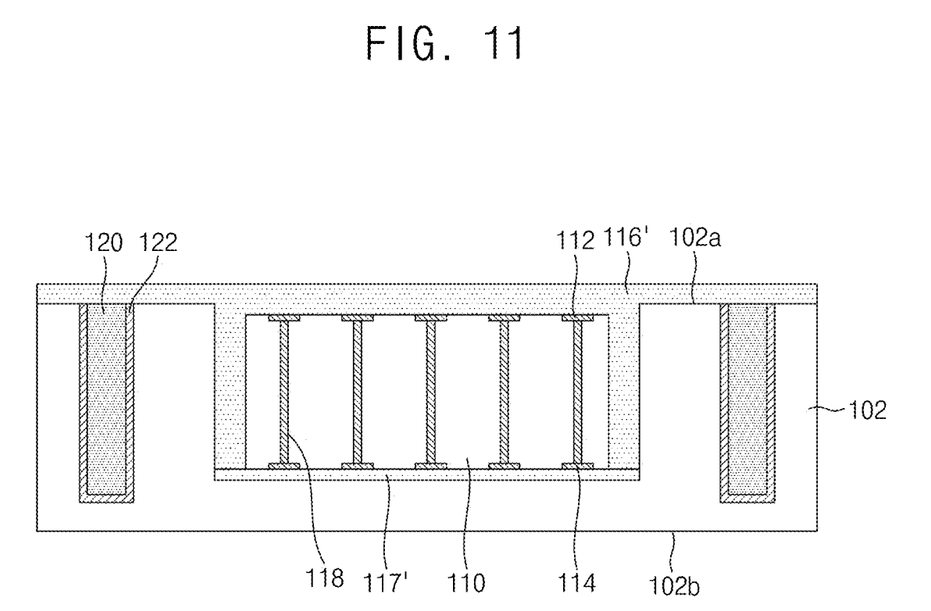

Referring to FIG. 11, an encapsulant 116' may be formed in the first trench 104' to fill a space in the first trench 104'. The encapsulant 116' may cover side surfaces and a lower portion of the first trench 104', an upper surface and side surfaces of the first semiconductor chip 110, and the first surface 102a of the substrate 102. An upper end of the encapsulant 116' may be at a higher level than the first surface 102a of the substrate 102 and the upper surface of the first semiconductor chip 110. The encapsulant 116' may be resin including epoxy, polyimide, or the like. For example, the encapsulant 116' may be bisphenol-group epoxy resin, polycyclic aromatic epoxy resin, o-cresol novolac epoxy resin, biphenyl-group epoxy resin, naphthalene-group epoxy resin, or the like.

Figure 12:
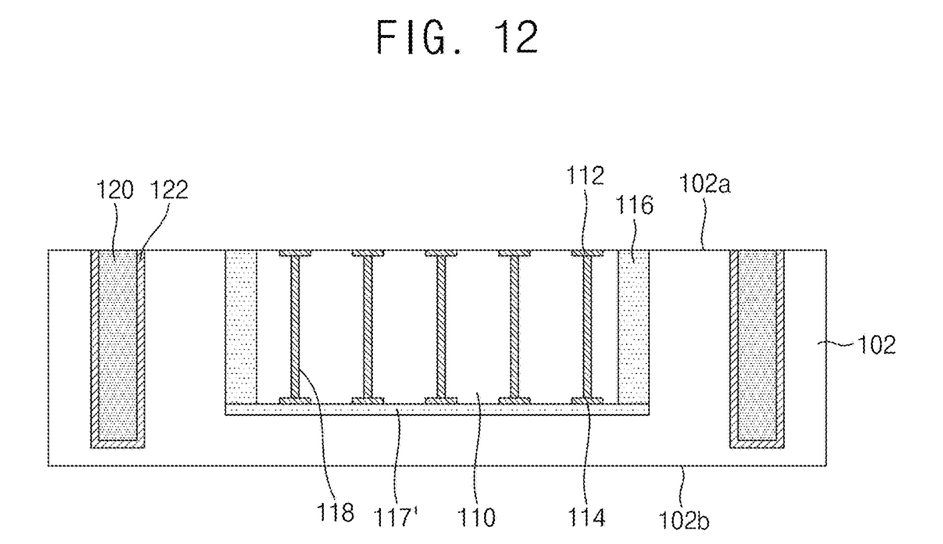

Referring to FIG. 12, an encapsulant 116 may be formed by etching the encapsulant 116' by a planarization process. The first surface 102a of the substrate 102 and the first semiconductor chip 110 may be exposed by the planarization process. In an embodiment, the upper surface of the first semiconductor chip 110 and an upper end of the encapsulant 116 may be at the same level.

Figure 13A:
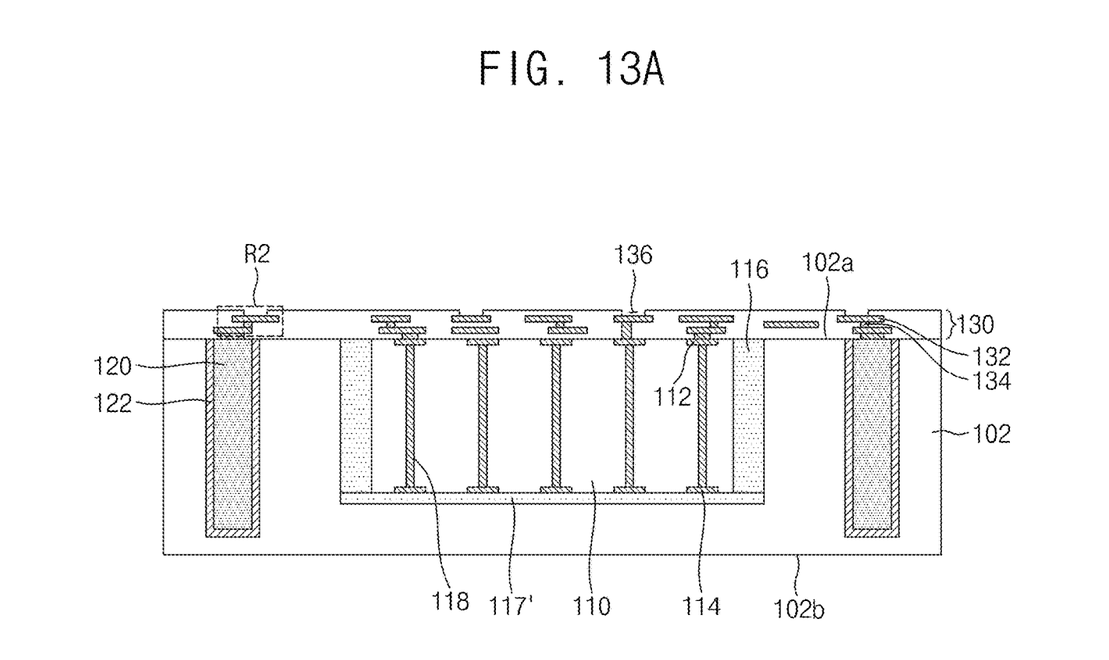
Figure 13B:
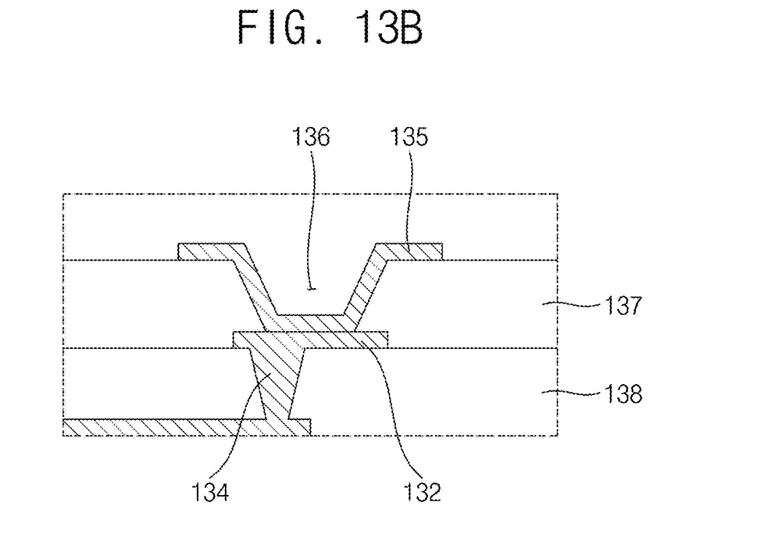

Referring to FIG. 13A, a first redistribution layer 130 may be formed on the first surface 102a of the substrate 102. FIG. 13B is an enlarged view of a portion of a region R2 illustrated in FIG. 13A. Referring to FIG. 13B, the first redistribution layer 130 may include an interconnection pattern 132, a via 134, an under-bump metal 135, an insulating layer 138, and a passivation layer 137. First, the insulating layer 138 is formed on the substrate 102, the first semiconductor chip 110, and the conductive via 120. A plurality of insulating layers 138 may be stacked. The insulating layer 138 may cover the upper pad 112 of the first semiconductor chip 110 or the interconnection pattern 132. Next, a portion of the insulating layer 138 is etched to expose the upper pad 112 or the interconnection pattern 132. The interconnection pattern 132 and the via 134 may also be formed on the exposed upper pad 112 or the interconnection pattern 132. Thereafter, the passivation layer 137 may be formed on the interconnection pattern 132 to protect the interconnection pattern 132 on the first redistribution layer 130. The opening 136 is formed by etching a portion of the passivation layer 137 to expose the interconnection pattern 132. The under-bump metal 135 may be formed on the exposed interconnection pattern 132 and passivation layer 137.

The interconnection pattern 132 may be formed on different layers in the first redistribution layer 130 and may provide a signal transmission path. The via 134 may electrically connect portions of the interconnection pattern 132 formed on the different layers. The via 134 may be formed of a conductive material and may be completely filled with the conductive material. The via 134 may be formed on a surface of a wall of a via hole and may have a cylindrical shape as well as a tapered shape. The via 134 may be integrally formed with the interconnection pattern 132 of the first redistribution layer 130. The insulating layer 138 and the passivation layer 137 may electrically insulate the interconnection pattern 132 and the via 134 from an external device. An inner connecting member 156 which will be described below may be formed on the under-bump metal 135. The under-bump metal 135 may limit and/or prevent diffusion of the inner connecting member 156.

The interconnection pattern 132 and the via 134 may each include a conductive material such as copper (Cu), aluminum (Al), silver (Ag), tin (Sn), gold (Au), nickel (Ni), lead (Pb), titanium (Ti), or an alloy thereof. The passivation layer 137 and the insulating layer 138 may each include at least one of $SiO_2$, $Si_3N_4$, SiON, $Ta_2O_5$, $HfO_2$, Polylmide (PI), Poly Benz Oxazole (PBO), Benzi Cyclo Butene (BCB), BismaleimideTriazine (BT), or photosensitive resin. The under-bump metal 135 may include at least one of chromium/chromium-copper alloy/copper (Cr/Cr-Cu/Cu), titanium-tungsten/alloy copper (Ti—W/Cu), aluminum/nickel/copper (Al/Ni/Cu), or nickel. The under-bump metal 135 may be formed by one of sputtering, electroplating, or electroless plating.

Figure 14:
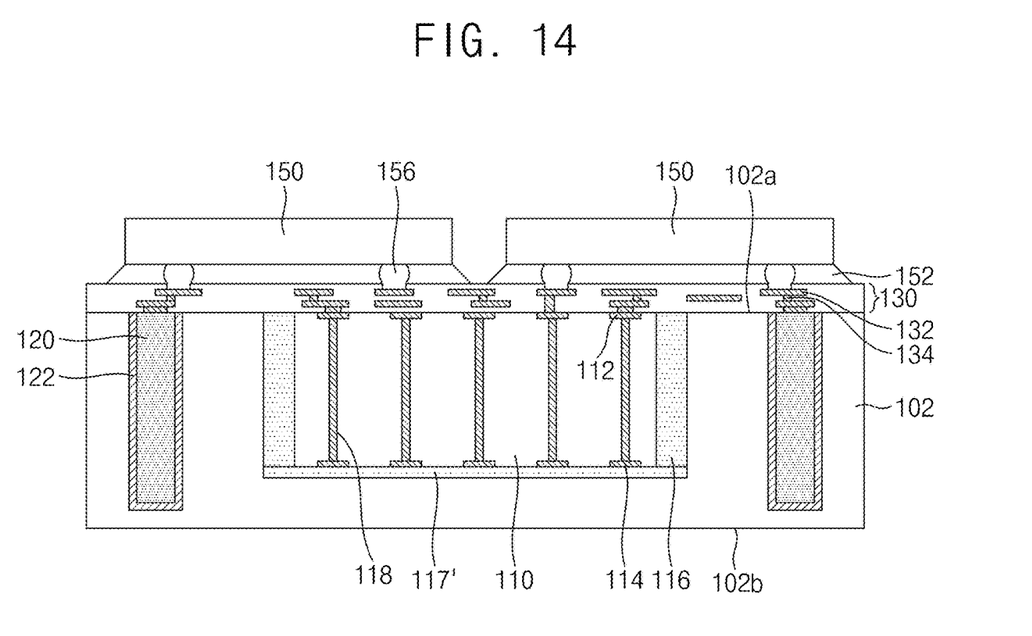

Referring to FIG. 14, at least one second semiconductor chip 150 may be mounted on the first redistribution layer 130. An underfill 152 may be formed between the first redistribution layer 130 and the second semiconductor chip 150. The inner connecting member 156 may be formed below the second semiconductor chip 150 and may electrically connect the interconnection pattern 132 of the first redistribution layer 130 and the second semiconductor chip 150.

In an embodiment, the second semiconductor chip 150 may be mounted on the first redistribution layer 130 by thermal-compression (TC) bonding. The second semiconductor chip 150 having the inner connecting member 156 formed on a lower surface thereof may be adsorbed onto the first redistribution layer 130 using a bonding machine (not shown). The second semiconductor chip 150 may be moved to position the inner connecting member 156 at a location corresponding to the interconnection pattern 132, and then be pressurized and heated by the bonding machine. The inner connecting member 156 may be coupled to the interconnection pattern 132 by TC bonding. In an embodiment, the underfill 152 may be an NCF. The NCF may be attached to a lower surface of the second semiconductor chip 150 and pressurized and heated by the bonding machine. In an embodiment, the underfill 152 may be an NCP. The NCP may be attached to an upper surface of the first redistribution layer 130 and pressurized and heated by the bonding machine. In an embodiment, the underfill 152 may be formed below the second semiconductor chip 150 after the second semiconductor chip 150 is coupled to the first redistribution layer 130 by TC bonding.

Figure 15:
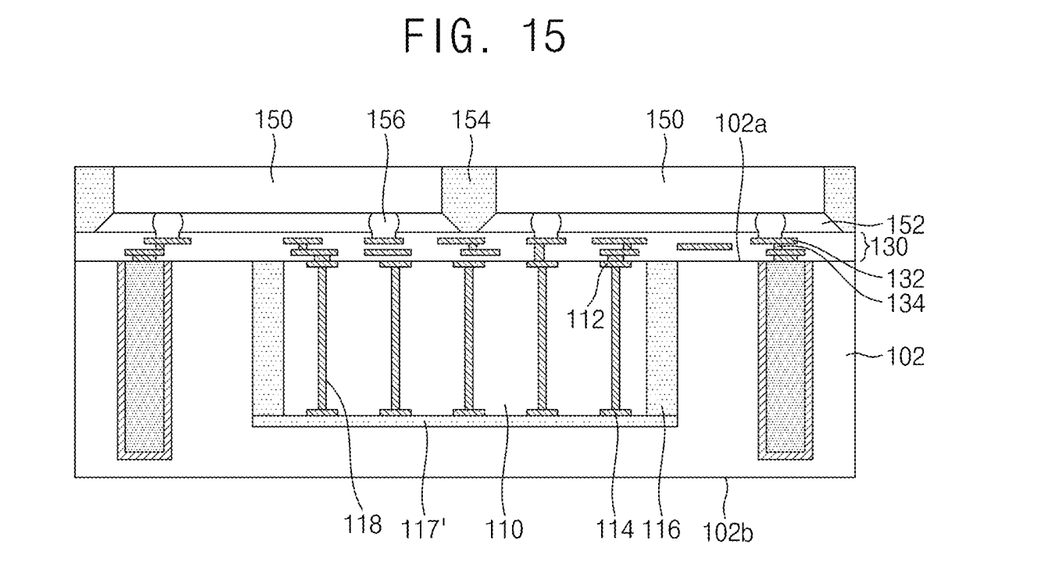

Referring to FIG. 15, an encapsulant 154 may be formed between the upper surface of the first redistribution layer 130 and the second semiconductor chips 150. The encapsulant 154 may protect the second semiconductor chips 150 from being damaged. An upper portion of the encapsulant 154 may be partially etched by a planarization process after being formed on and/or between the second semiconductor chip 150. An upper end of the encapsulant 154 may be located at the same level as that of the second semiconductor chip 150, and a side surface thereof may be aligned with side surfaces of the substrate 102 and the first redistribution layer 130. The encapsulant 154 may be resin including epoxy or polyimide. As an example, the encapsulant 154 may be bisphenol-group epoxy resin, polycyclic aromatic epoxy resin, o-cresol novolac epoxy resin, biphenyl-group epoxy resin, naphthalene-group epoxy resin, or the like.

Figure 16:
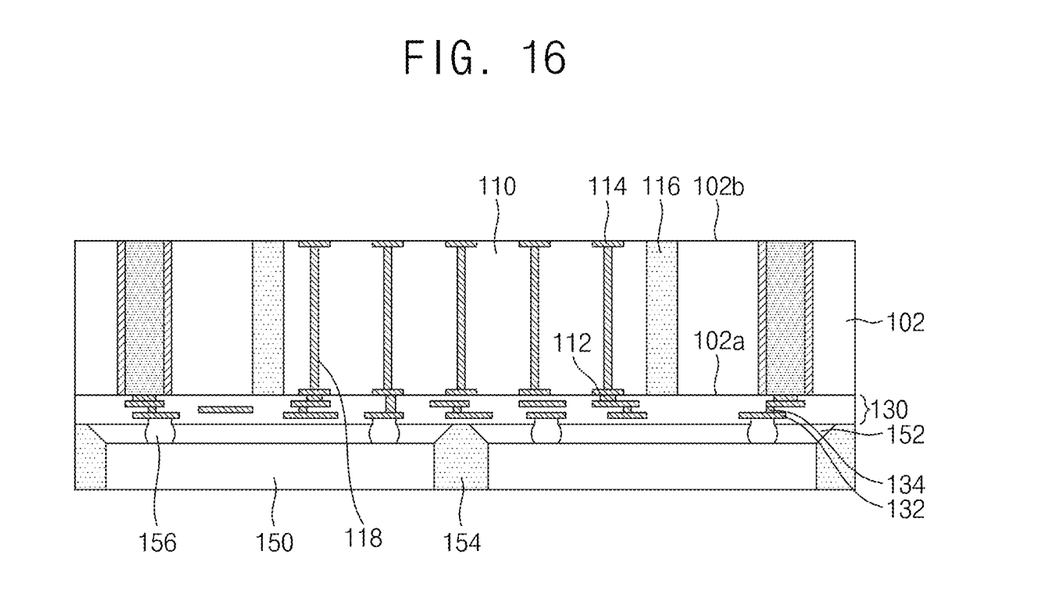

Referring to FIG. 16, the substrate 102 may be inverted such that the second surface 102b faces upward. Thereafter, portions of the second surface 102b of the substrate 102, the conductive via 120, and the via insulating layer 122 may be removed by a planarization process. The second surface 102b of the substrate 102 is etched by the planarization process to form a cavity 104 and through holes 106. Furthermore, a portion of the first semiconductor chip 110 may be removed and the adhesive 117' attached to the first semiconductor chip 110 may be removed by the planarization process. In an embodiment, after the planarization process, a portion of the adhesive 117' may not be etched and may remain on a side surface of the first semiconductor chip 110. The planarization process may be performed without forming a carrier to support the second semiconductor chip 150 and the encapsulant 154 from below.

Figure 17:
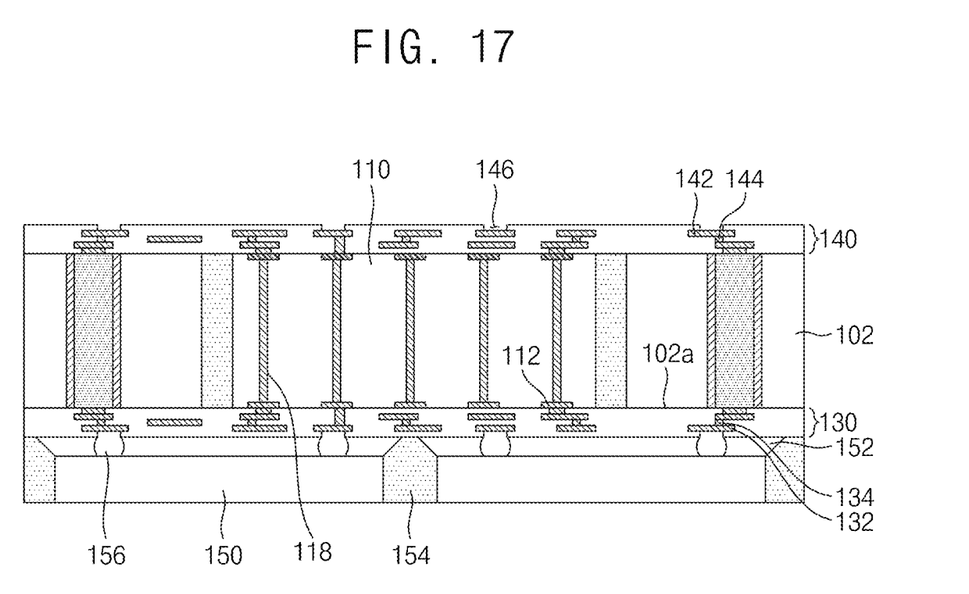

Referring to FIG. 17, a second redistribution layer 140 may be formed on the second surface 102b of the substrate 102. The second redistribution layer 140 may include an interconnection pattern 142 consisting of a plurality of layers and a via 144 connecting the plurality of layers of the interconnection pattern 142. The second redistribution layer 140 may be formed by the method described above with reference to FIG. 14. After the second redistribution layer 140 is formed, an upper surface of the second redistribution layer 140 may be partially etched to form an opening 146. The interconnection pattern 142 may be exposed to the outside via the opening 146.

Referring to FIG. 2, an external connecting member 160 may be formed on the second redistribution layer 140 of FIG. 17. The external connecting member 160 may be connected to the exposed interconnection pattern 142 of the second redistribution layer 140. In an embodiment, the external connecting member 160 may be a solder ball. The solder ball may include at least one of tin (Sn), silver (Ag), copper (Cu), palladium (Pd), bismuth (Bi), or antimony (Sb).

Referring to FIG. 1, a singulation process may be performed along the scribe line 30 on the wafer 10. The semiconductor package 100 is completed by the singulation process.

According to example embodiments of inventive concepts, fine pitches may be obtained by forming conductive vias in a silicon substrate, thereby minimizing a size of a semiconductor package.

According to example embodiments of inventive concepts, spacers may be formed on side surfaces of a semiconductor chip and thus a semiconductor package can be manufactured without forming a carrier to support a wafer.

According to example embodiments of inventive concepts, redistribution layers may be formed to be electrically connected to upper and lower parts of a semiconductor chip and thus a high-performance semiconductor package can be obtained.

While the embodiments of inventive concepts have been described with reference to the accompanying drawings, it should be understood by those skilled in the art that various modifications may be made without departing from the scope of inventive concepts. Therefore, the above-described embodiments should be considered in a descriptive sense only and not for purposes of limitation.

What is claimed is:
1. A semiconductor package comprising:
a first redistribution layer;
a second redistribution layer below the first redistribution layer;
a plurality of conductive vias electrically connecting the first redistribution layer and the second redistribution layer;
a lower semiconductor chip on the second redistribution layer, the lower semiconductor chip including a through-electrode passing through the lower semiconductor chip; and
an upper semiconductor chip on the lower semiconductor chip;
wherein the upper semiconductor chip is electrically connected to the first redistribution layer and the lower semiconductor chip is electrically connected to the second redistribution layer; and
wherein the plurality of conductive vias surround the lower semiconductor chip and the upper semiconductor chip
wherein a lower surface of the lower semiconductor chip is located at a same level as a lower surface of the plurality of conductive vias, and
an upper surface of the upper semiconductor chip is located at a same level as an upper surface of the plurality of conductive vias.

2. The semiconductor package of claim 1, further comprising:
 via insulating layers covering side surfaces of the plurality of conductive vias.

3. The semiconductor package of claim 2, wherein the via insulating layers have a diameter of 2 to 50 μm.

4. The semiconductor package of claim 1, wherein lower portions of the plurality of conductive vias extend to an upper surface of the second redistribution layer.

5. The semiconductor package of claim 1, wherein an upper surface of the plurality of conductive vias extend to a lower surface of the first redistribution layer.

6. The semiconductor package of claim 1, further comprising an external connecting member on a lower surface of the second redistribution layer,
 wherein the lower semiconductor chip is electrically connected to the external connecting member via the second redistribution layer.

7. The semiconductor package of claim 1, further comprising:
 an inner connecting member between the lower semiconductor chip and the upper semiconductor chip,
 wherein the lower semiconductor chip is electrically connected to the upper semiconductor chip via the inner connecting member.

8. A semiconductor package comprising:
 a first redistribution layer;
 a second redistribution layer below the first redistribution layer;
 a plurality of conductive vias electrically connecting the first redistribution layer and the second redistribution layer;
 a lower semiconductor chip on the second redistribution layer, the lower semiconductor chip including a through-electrode passing through the lower semiconductor chip; and
 an upper semiconductor chip on the lower semiconductor chip;
 wherein the upper semiconductor chip is electrically connected to the first redistribution layer and the lower semiconductor chip is electrically connected to the second redistribution layer;
 wherein the plurality of conductive vias surround the lower semiconductor chip and the upper semiconductor chip; and
 wherein the lower semiconductor chip and the upper semiconductor chip are disposed in a cavity between the first redistribution layer the second redistribution layer.

9. The semiconductor package of claim 8, wherein the cavity has a width of 3 to 200 mm.

10. The semiconductor package of claim 8, further comprising:
 a first encapsulant in the cavity,
 wherein the first encapsulant is between an inner side surface of the cavity and a side surface of the lower semiconductor chip and the upper semiconductor chip.

11. The semiconductor package of claim 8, wherein
 a lower surface of the lower semiconductor chip is located at a same level as a lower surface of the plurality of conductive vias, and
 an upper surface of the upper semiconductor chip is located at a same level as an upper surface of the plurality of conductive vias.

12. A semiconductor package comprising:
 a first redistribution layer;
 a second redistribution layer below the first redistribution layer;
 a plurality of conductive vias electrically connecting the first redistribution layer and the second redistribution layer;
 a first lower semiconductor chip on the second redistribution layer, the first lower semiconductor chip including a through-electrode passing through the first lower semiconductor chip in a vertical direction;
 a first upper semiconductor chip on the first lower semiconductor chip;
 an inner connecting member between the first lower semiconductor chip and the first upper semiconductor chip;
 at least one second semiconductor chip on the first redistribution layer; and
 an external connecting member on a lower surface of the second redistribution layer;
 wherein the first upper semiconductor chip is electrically connected to the first redistribution layer and the first lower semiconductor chip is electrically connected to the second redistribution layer;
 wherein the plurality of conductive vias surround the first lower semiconductor chip and the first upper semiconductor chip;
 wherein a lower surface of the first lower semiconductor chip is located at a same level as a lower surface of the plurality of conductive vias, and
 an upper surface of the first upper semiconductor chip is located at a same level as an upper surface of the plurality of conductive vias.

13. The semiconductor package of claim 12 further comprising a via insulating layers covering side surfaces of the plurality of conductive vias.

14. The semiconductor package of claim 12, wherein the at least one second semiconductor chip is second semiconductor chips, and the second semiconductor chips are electrically connected to each other via the first redistribution layer.

15. The semiconductor package of claim 13, wherein the external connecting member is electrically connected to the at least one second semiconductor chip via the first redistribution layer, the plurality of conductive vias, and the second redistribution layer.

16. The semiconductor package of claim 13, wherein the first upper semiconductor chip is electrically connected to the at least one second semiconductor chip via the first redistribution layer.

17. The semiconductor package of claim 15, wherein the first lower semiconductor chip is electrically connected to the at least one second semiconductor chip via the first redistribution layer, the first upper semiconductor chip and the inner connecting member.

18. The semiconductor package of claim 12, wherein the first lower semiconductor chip and the first upper semiconductor chip are disposed in a cavity between the first redistribution layer the second redistribution layer.

* * * * *